United States Patent

Gamo

[11] Patent Number: 5,844,348
[45] Date of Patent: Dec. 1, 1998

[54] PIEZOELECTRIC RESONANT PART AND METHOD OF MANUFACTURING THE SAME

[75] Inventor: Masao Gamo, Nagaokakyo, Japan

[73] Assignee: Murata Manufacturing Co., Ltd., Kyoto-fu, Japan

[21] Appl. No.: 661,001

[22] Filed: Jun. 10, 1996

[30] Foreign Application Priority Data

Jun. 6, 1995 [JP] Japan .................................. 7-143379

[51] Int. Cl.⁶ .................................................. H01L 41/08
[52] U.S. Cl. ......................... 310/340; 310/366; 310/348
[58] Field of Search .................................. 310/320, 340, 310/346, 344, 348, 366

[56] References Cited

U.S. PATENT DOCUMENTS

| | | | |
|---|---|---|---|
| 5,263,198 | 11/1993 | Geddes et al. | 455/325 |
| 5,357,662 | 10/1994 | Takagi et al. | 310/340 X |
| 5,410,789 | 5/1995 | Noto et al. | 310/340 X |
| 5,504,980 | 4/1996 | Yoshinaga et al. | 310/366 X |
| 5,623,236 | 4/1997 | Yoshinaga et al. | 310/340 X |

FOREIGN PATENT DOCUMENTS

| | | |
|---|---|---|
| 33920 | 8/1981 | European Pat. Off. . |
| 1152278 | 5/1969 | United Kingdom . |
| 2278721 | 12/1994 | United Kingdom .................. 310/340 |

*Primary Examiner*—Mark O. Budd
*Attorney, Agent, or Firm*—Ostrolenk, Faber, Gerb & Soffen, LLP

[57] ABSTRACT

A piezoelectric resonant part includes a piezoelectric substrate having first and second opposed main surfaces, electrode patterns formed on the main surfaces; and protective substrates bonded to respective ones of the main surfaces of the piezoelectric substrate via adhesive layers to form a laminate. Each of the adhesive layers comprising a first layer made of a soft adhesive whose Shore hardness is less than D60 and a second layer made of a hard adhesive whose Shore hardness is more than D60. External electrodes are formed on exposed surfaces of the piezoelectric resonant part. Only the second adhesive layers are exposed in the areas where the external electrodes are located such that the external electrodes do not contact the relatively soft first adhesive layers. The piezoelectric resonant part is made by forming a respective first adhesive layer on a main surface of each of the protective substrates and then forming a respective second adhesive layer on each of the first layers. The protective substrates are then laminated onto respective main surfaces of the piezoelectric substrate with the second layers abutting the main surfaces of the piezoelectric substrate.

12 Claims, 5 Drawing Sheets

FIG. 7
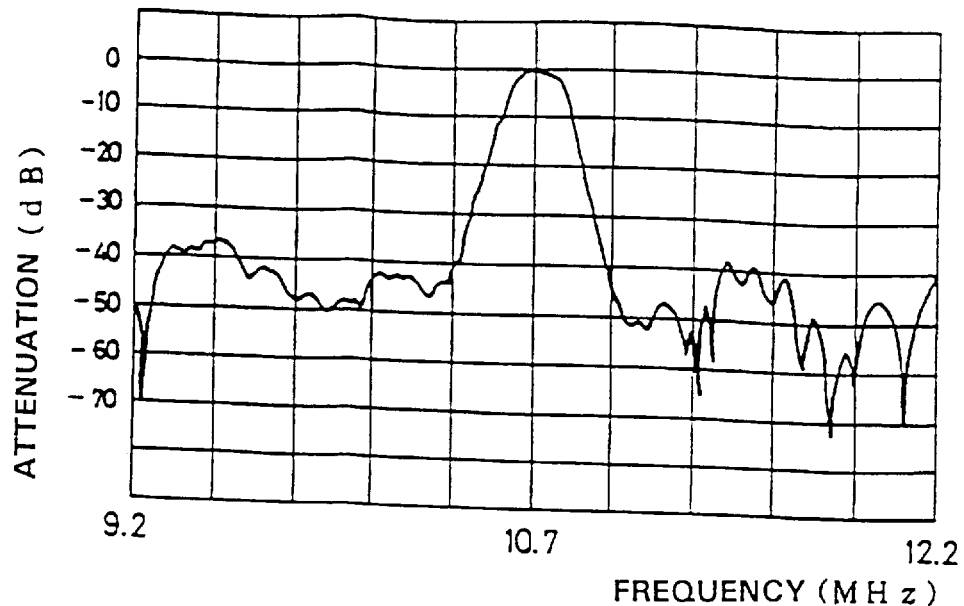
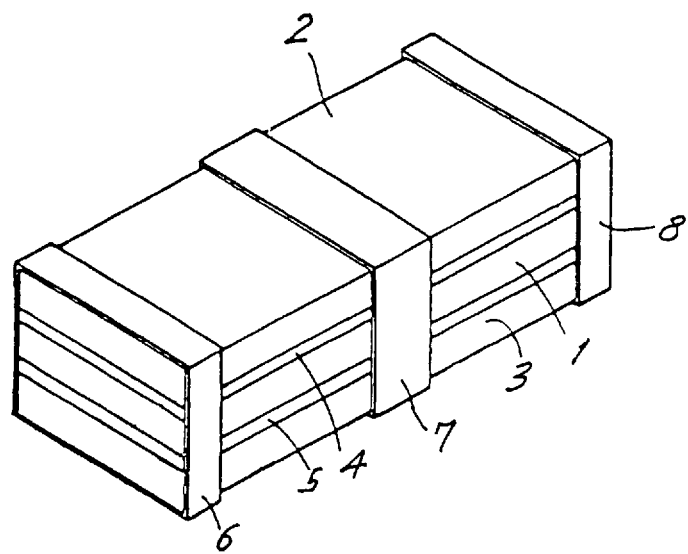
FIG. 8 PRIOR ART

PIEZOELECTRIC RESONANT PART AND METHOD OF MANUFACTURING THE SAME

BACKGROUND OF THE INVENTION

1. Field of the Invention

The present invention relates to a structure for and method of manufacturing a piezoelectric resonant part such as a chip type ceramic filter.

2. Description of Prior Art

Referring to FIG. 8, a prior art piezoelectric filter (which is one type of piezoelectric resonant part) includes a piezoelectric substrate 1 having predetermined electrode patterns (not shown) formed on its opposing main surfaces. The electrode patterns cooperate with the intervening piezoelectric substrate to form first and second vibrating elements which are spaced apart from one another. A pair of protective substrates 2, 3 are bonded to opposite main surfaces of the piezoelectric substrate 1 via adhesive layers 4, 5, respectively. External electrodes 6, 7, 8 are formed on the outer periphery of both the piezoelectric substrate 1 and the protective substrates 2, 3.

In a first known piezoelectric filter (hereinafter referred to a first prior art example), adhesive layers 4, 5 are made of a hard adhesive such as an epoxy resin whose Shore hardness is around D70 to D80 after hardening and the protective substrates 2, 3 are made of an epoxy material.

In a second known piezoelectric filter (hereinafter referred to as a second prior art example), the adhesive layers 4, 5 each have a one-layer structure composed of a soft epoxy resin whose Shore hardness is around D30 and the protective substrates 2, 3 are made of a magnesium titanate material.

While not shown in FIG. 5, it is common to provide vibration spaces for the vibrating elements of the electrode pattern by forming open spaces within the adhesive layers 4, 5 at positions corresponding to the vibrating elements in the piezoelectric filter having the structure of the first prior art example. In the piezoelectric filter having the structure of the second prior art example, however, concave portions for use as vibration spaces are formed on the internal surfaces of the protective substrates 2, 3 because it is difficult to assure adequate vibration spaces if openings are only formed in the soft adhesive layers 4, 5.

Piezoelectric filters of this type are often mounted on a circuit board using a reflow soldering process. When the piezoelectric filter having the structure of the first prior art example is mounted using this process, the filter sometimes exhibits a significant change of frequency. This is especially true when the piezoelectric filter is located in a humid atmosphere. It is believed that such problems are caused by stresses applied to the piezoelectric substrate 1 resulting from expansion or contraction of the glass/epoxy resin protective substrates 2, 3 due to the infiltration of moisture.

On the other hand, the piezoelectric filter having the structure of the second prior art example has drawbacks in that it takes time to prepare the protective substrates 2, 3 and it is costly to form the concave portions in the magnesium titanate protective substrates 2, 3 for use as the vibration spaces. Further, the thickness of the adhesive layers 4, 5 has to be kept thin in order not to disconnect the electrodes 6, 7, 8 because the adhesive layers 4, 5 are formed using a soft adhesive. However, the thin adhesive layers 4, 5 cannot exert a desired damping effect, thus causing the filter to exhibit significant spurious characteristics.

It is one object of the present invention to solve the aforementioned problems by providing piezoelectric resonant part, and a method for manufacturing such a part, which does not require concave portions to be formed on the internal surfaces of the protective substrates in order to provide the necessary vibration space for the vibrating elements and which can prevent the outer electrodes from being disconnected.

It is another object of the present invention to provide a piezoelectric filter which exhibits fewer spurious characteristics while suppressing changes of frequency due to the infiltration of moisture.

SUMMARY OF THE INVENTION

The piezoelectric resonant part of the present invention includes:

a piezoelectric substrate having first and second opposed main surfaces;

electrode patterns formed on said main surfaces; and protective substrates bonded to respective ones of said main surfaces via adhesive layers to form a laminate, said adhesive layers comprising a first layer made of a soft adhesive whose Shore hardness is less than D60 and a second layer made of a hard adhesive whose Shore hardness is more than D60.

In the preferred embodiment, the piezoelectric resonant part includes external electrodes formed on exposed surfaces of the laminate. The exposed surfaces of the laminate include exposed sides of the piezoelectric and protective substrates and the external electrodes are formed on the exposed sides.

To prevent the outer electrodes from being disconnected, only the second adhesive layer is exposed on the area where the external electrodes are located such that the external electrodes are not in contact with the first adhesive layers.

The first adhesive layers are preferably disposed on the side of its associated protective substrate and the second adhesive layers are preferably disposed on the side of the piezoelectric substrate.

The electrode patterns preferably cooperate with the piezoelectric substrate to define a vibrating element. Cut out portions are formed in the second adhesive layers, and if necessary also in the first adhesive layers, to define vibration spaces for the vibrating element. Cut out portions are not formed in the protective substrates.

The method of the present invention is directed towards a method for manufacturing a piezoelectric resonant part which includes a piezoelectric substrate having electrode patterns formed on opposing main surfaces of the piezoelectric substrate, the piezoelectric substrate being sandwiched between a pair of protective substrates. The method comprises the steps of:

forming a respective first adhesive layer made of a first adhesive material on a main surface of each of said protective substrates;

forming a respective second adhesive layer made of a second adhesive material which is harder than said first adhesive material on each of said first layers; and laminating said protective substrates to said respective main surfaces of said piezoelectric substrate with said respective second layers abutting said respective main surfaces of said piezoelectric substrate.

Because the first adhesive layer is formed of a relatively soft adhesive and the second adhesive layer is formed of a relatively hard adhesive, it is possible to provide vibration spaces in the hard second adhesive layer and to obtain a desired damping effect. Further, because the first adhesive layer is made of the soft adhesive stresses caused by expansion and contraction of the protective substrates are absorbed by the first adhesive layer and not applied (or at least dampened before being applied) to the piezoelectric substrate. This reduces the changes of frequency which would otherwise occur after the reflow process is completed or under the humid atmospheric conditions.

The above and other advantages of the present invention will become more apparent in the following description and the accompanying drawings.

BRIEF DESCRIPTION OF THE DRAWINGS

For the purpose of illustrating the invention, there is shown in the drawing a form which is presently preferred, it being understood, however, that the invention is not limited to the precise arrangement and instrumentality shown.

FIG. 7 is a graph showing a filtering characteristic of the piezoelectric filter of the second prior art example; and FIG. 8 is a perspective view illustrating a prior art piezoelectric filter.

DETAILED DESCRIPTION OF EMBODIMENTS OF THE INVENTION

Figure 1:
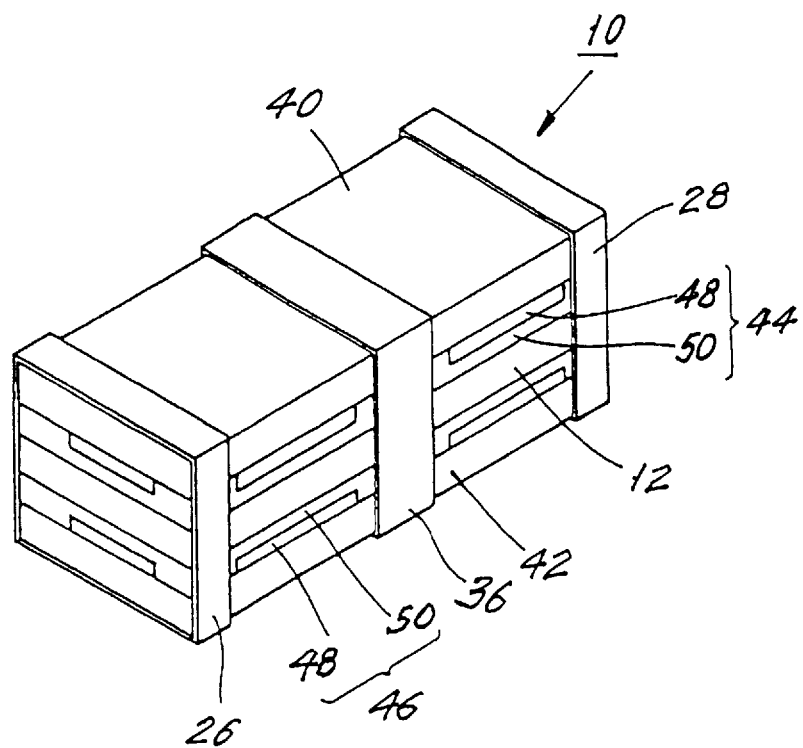
FIG. 1 is a perspective view of a piezoelectric filter constructed in accordance with a preferred embodiment of the present invention.
Figure 2:
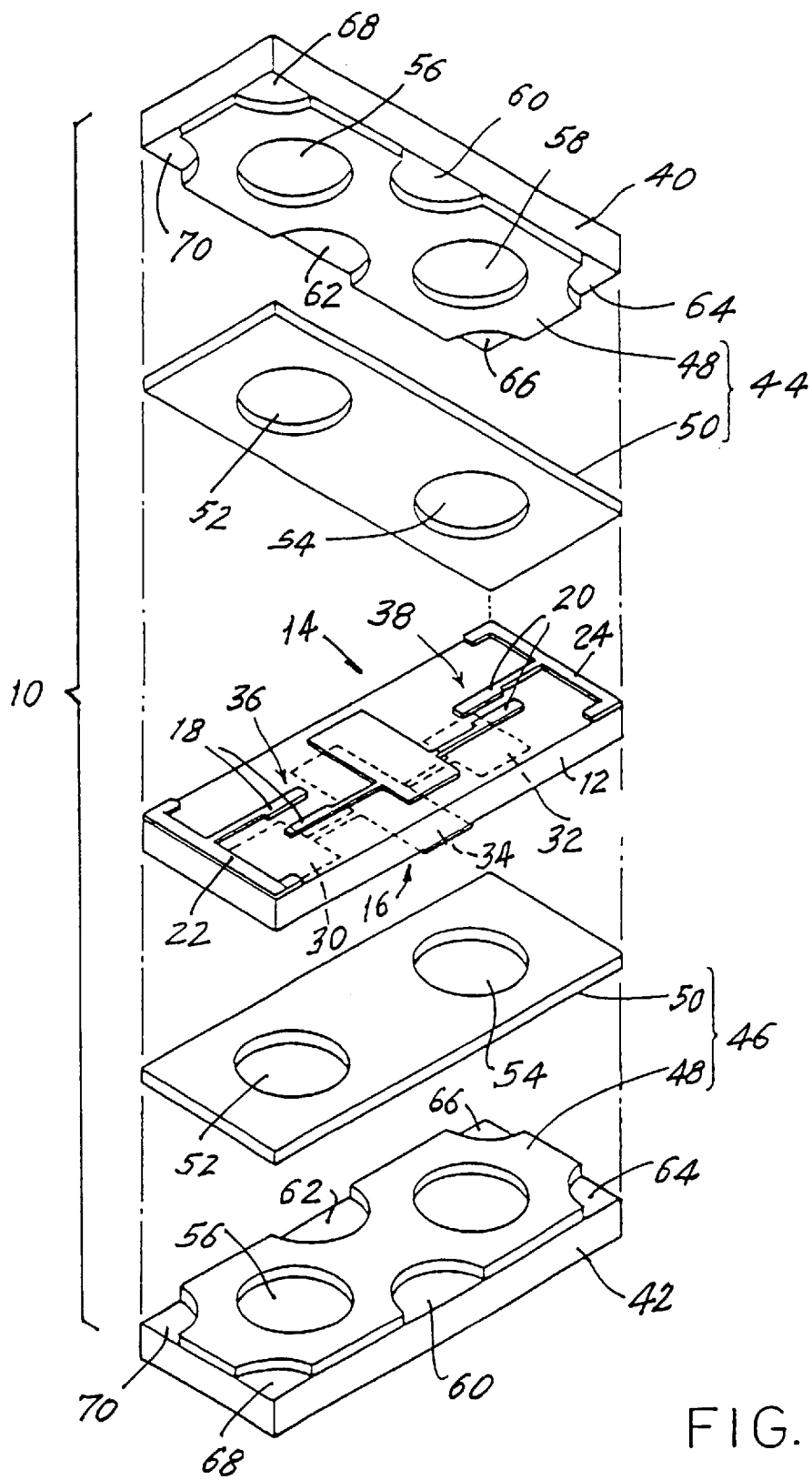
FIG. 2 is an exploded perspective view of the piezoelectric filter shown in FIG. 1.

Referring now to the drawings, wherein like numerals indicate like elements, there is shown in FIGS. 1 and 2 a piezoelectric filter (which is one example of a piezoelectric resonant part) constructed in accordance with the principles of the present invention and designated generally as 10.

Piezoelectric filter 10 comprises a rectangular piezoelectric substrate 12 (preferably made of PZT) having electrode patterns 14, 16 formed on opposite main surfaces thereof. The electrode pattern 14 includes vibrating electrodes 18, 20 and input/output electrodes 22, 24 which extend to the periphery of piezoelectric substrate 12 (FIG. 2) to be connected to external electrodes 26, 28 (FIG. 1), respectively. The vibrating electrodes 18, 20 oppose respective ground electrodes 30, 32 which are formed on the bottom side of the piezoelectric substrate 12 as part of the electrode pattern 16. The ground electrodes 30, 32 are connected to a central ground electrode 34 whose outer edges extend to the outer edge of the piezoelectric substrate 12 (FIG. 2) to be connected to the central external electrode 36 (FIG. 1). The ground electrode 30 cooperates with the opposing vibrating electrodes 18 and the intervening piezoelectric substrate 12 to form a first vibrating element 36. In a like manner, the ground electrode 32 cooperates with opposing vibrating electrodes 20 and the intervening piezoelectric substrate 12 to form a second vibrating element 38.

A pair of protective substrates 40, 42 are bonded to respective main surfaces of the piezoelectric substrate 12 via adhesive layers 44, 46, respectively. Each of the protective substrates 40, 42 is preferably formed of a plate-like glass/epoxy material or a magnesium titanate material.

The adhesive layers 44, 46 are formed by laminating a first adhesive layer 48, formed of a soft adhesive such as an epoxy resin whose Shore hardness after hardening is less than D60, e.g. around D30, and a second adhesive layer 50 formed of a hard adhesive such as an epoxy resin whose Shore hardness exceeds D60, e.g. around D70 to D80. Each first layer 48 is disposed adjacent its associated protective substrate 40, 42 and each second adhesive layer 50 is disposed adjacent a respective main surface of piezoelectric substrate 12. Circular cut out portions 52, 54 are formed in the second adhesive layers 50 and are disposed to face and surround the vibrating elements 36, 38 to provide a vibration space for these elements. The adhesive layers are preferably formed of a thermosetting material such as epoxy.

Where necessary, similarly cut out portions 56, 58 are formed in the first adhesive layers 48 at positions corresponding to the cut out portions 52, 54, respectively, to increase the size of the vibrating spaces. If a sufficient vibration space can be obtained by forming only the cut-out portions 52, 54 in the second adhesive layer 50, the additional cut-out portions 56, 58 in the first adhesive layer 48 need not be provided.

Semicircular cut-out portions 60, 62 are formed in the first adhesive layers 48 at positions corresponding to the location of the external electrode 36 (FIG. 1). Quarter circular cut-out portions 64, 66 are formed at positions corresponding to the external electrode 28 and quarter circular cut-out portions 68, 70 are formed at positions corresponding to the external electrode 26. Cut out portions 60–70 are formed to ensure that the first adhesive layers 48 do not extend to the exposed peripheral surface of the piezoelectric filter 10 in the area where the external electrodes 26, 28 and 36 are located. As a result, the soft adhesive material will not permit expansion and contraction in the area of the external electrodes 26, 28 and 36 and thereby will not cause those electrodes to be disconnected.

The piezoelectric filter of the present invention is preferably constructed as follows.

A soft adhesive is applied on the main surface of the protective substrates 40, 42 by means of screen printing or other suitable process to form the first adhesive layer 48. The first adhesive layer 48 is formed with the required cut out portions. After the soft adhesive is fully hardened (e.g., by thermosetting an epoxy adhesive), a hard adhesive is applied onto the first adhesive layer 48 by means of screen printing or other suitable process. The second adhesive layer 50 is also formed with the required cut out portions. The hard adhesive is then hardened (e.g., by thermosetting an epoxy) after sandwiching the piezoelectric substrate 12 between the protective substrates 40, 42 to form the second adhesive layer 50. The piezoelectric filter having the structure shown in FIG. 1 is then completed by forming the external electrodes 26, 28 and 36 along the periphery of the filter 10 including the exposed sides of the piezoelectric substrate 12 and the exposed sides of the protective substrates 40, 42, preferably by means of sputtering or a dry plating evaporation process.

Figure 3:
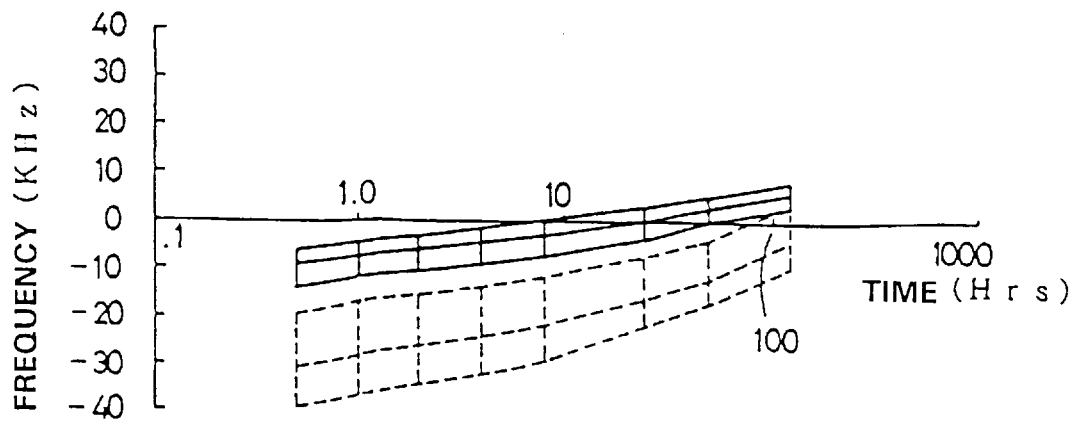
FIG. 3 is a graph showing how the frequency characteristic of both the present invention and the prior art device change over time after a reflow process has been performed.
Figure 4:
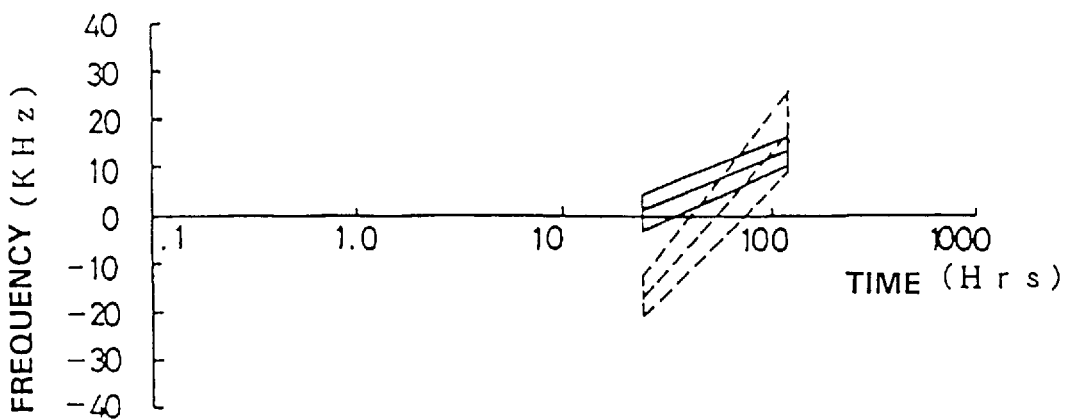
FIG. 4 is a graph showing how the frequency characteristic of both the present invention and the prior art device change over time when the devices are maintained in a humid atmosphere after a reflow process has been performed.

FIG. 3 is a graph showing how the frequency characteristics of the prior art filter and that of the inventive filter change over time after the completion of the reflow process. FIG. 4 is a graph shown how the frequency characteristics of the prior art filter and the filter of the present invention changes over time, after the completion of the reflow process, when maintained in a humid atmosphere. In FIGS. 3 and 4, characteristics shown by ten of the inventive piezoelectric filters are represented by solid lines and characteristics shown by the piezoelectric filter of the first prior art example are represented by broken lines. It is noted that the vertical axis within FIGS. 3 and 4 represents the variation (KHz) of a fundamental frequency and the horizontal axis represents elapsed time (Hrs.). The humid atmosphere condition was 95% of humidity at 60° C. It is apparent from these graphs that both change of frequency over time and the wet atmosphere characteristics have been improved considerably in the present invention as compared to those in the prior art.

Figure 5:
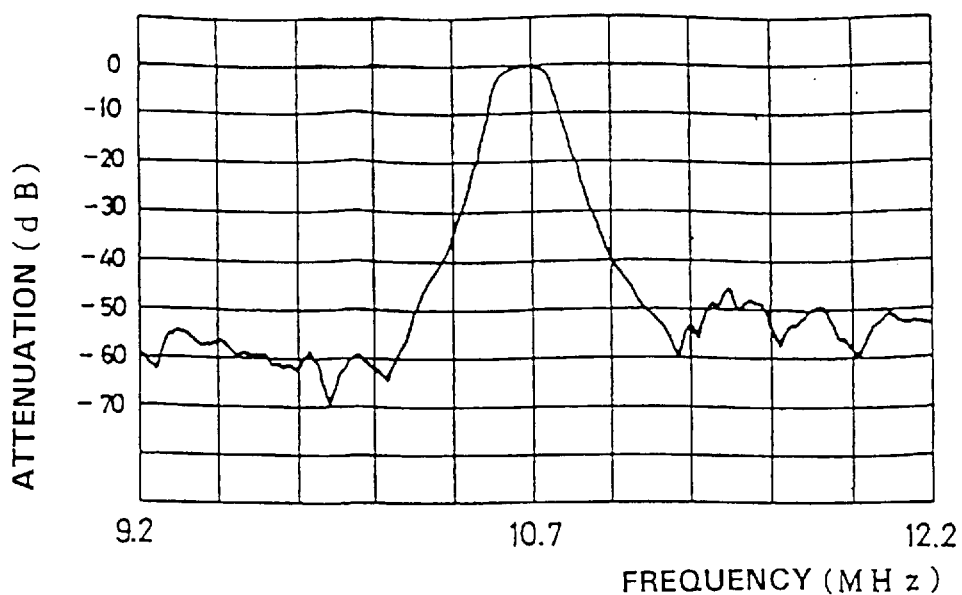
FIG. 5 is a graph showing a filtering characteristic of the piezoelectric filter of the present invention.
Figure 6:
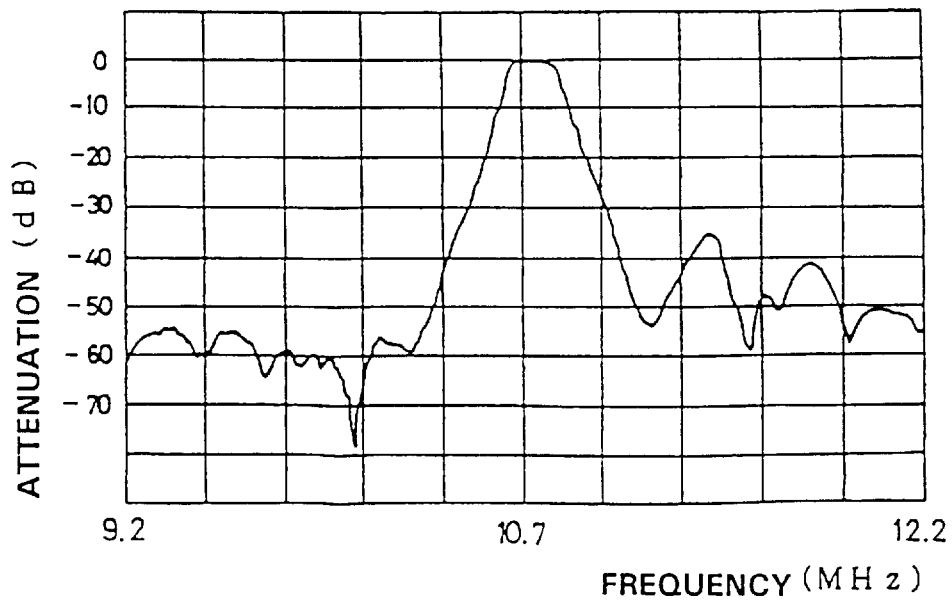
FIG. 6 is a graph showing a filtering characteristic of a piezoelectric filter of the first prior art example.

FIG. 5 is a graph showing a filtering characteristic of the piezoelectric filter according to the preferred embodiment of the present invention, FIG. 6 is a graph showing a filtering characteristic of the piezoelectric filter of the first prior art example, and FIG. 7 is a graph showing a filtering characteristic of the piezoelectric filter of the second prior art example. In these figures, the vertical axis represents attenuation (dB) and the horizontal axis represents frequency (MHz).

The piezoelectric filter 20 of the embodiment of the present invention used for these tests, had protective substrates 40, 42 made of a magnesium titanate material, first adhesive layers 48 made of an adhesive material 50 μm thick and having a Shore hardness of D30, second adhesive layers 50 made of an adhesive material 50 μm thick having a Shore hardness of D80. The piezoelectric filter of the first prior art example used for these tests included protective substrates 2, 3 made of magnesium titanate and adhesive layers 4, 5 100 μm thick and having a Shore hardness of D80. The piezoelectric filter of the second prior art example used for these test included protective substrates 2, 3 made of magnesium titanate and adhesive layers 4, 5 10 μm thick and having a Shore hardness of D30.

Comparing the filtering characteristic graphs with one another, it can be seen that although 46 dB of attenuation is obtained by the inventive piezoelectric filter, only 35 dB of attenuation is obtained by the piezoelectric filter of the first prior art example and only 39 dB of attenuation is obtained by the piezoelectric filter of the second prior art example. Accordingly, it can be seen that the filtering characteristic of the inventive piezoelectric filter has been improved considerably as compared to the prior art examples.

As described above, according to the inventive piezoelectric resonant part, the first adhesive layer interposed between the piezoelectric substrate and the protective substrates is formed by a soft adhesive and the second adhesive layer is formed by a hard adhesive, so that it is possible to provide the required vibration spaces in the second (hard) adhesive layer and to obtain a desired damping effect. As a result, it is no longer necessary to form concave portions in the protective substrates to assure the vibration spaces and an effective mans of preventing the external electrodes from being disconnected is provided. Further, a practical advantage of the disclosed manufacturing process can be obtained by disposing the second layer on the side of the piezoelectric substrate.

Further, according to the inventive piezoelectric filter, stresses caused by expansion and contraction of the protective substrates may be reduced by forming the first adhesive layer of the soft adhesive so that no stress will be applied to the piezoelectric substrate and so that changes in the frequency characteristics of the piezoelectric resonator part will not occur over time after the reflow process is completed and under humid atmospheric conditions, thus decreasing the spurious characteristics of the filter.

While a piezoelectric filter has been described to illustrate the present invention, the scope of the present invention is not confined only to such piezoelectric filter and the present invention may be applied to other piezoelectric resonant parts such as a ceramic oscillator, etc.

While a preferred embodiment has been described, variations thereto will occur to those skilled in the art within the scope of the present inventive concepts which are delineated by the following claim.

What is claimed is:

1. A piezoelectric resonant part, comprising:

a piezoelectric substrate having first and second opposed main surfaces;

electrode patterns formed on said main surfaces; and protective substrates bonded to respective ones of said main surfaces of said piezoelectric substrate via adhesive layers to form a laminate, each of said adhesive layers comprising a first layer made of a soft adhesive whose Shore hardness is less than D60 and a second layer made of a hard adhesive whose Shore hardness is more than D60.

2. The piezoelectric resonant part according to claim 1, further including external electrodes formed on exposed surfaces of said laminate.

3. The piezoelectric resonant part according to claim 2, where said exposed surfaces of said laminate include exposed sides of said piezoelectric and said protective substrates and wherein said external electrodes are formed on said exposed sides.

4. The piezoelectric resonant part according to claim 3, wherein only said second adhesive layers are exposed in the areas where said external electrodes are located such that said external electrodes are not in contact with said first adhesive layer.

5. The piezoelectric resonant part according to claim 4, wherein said first and second adhesive layers are laminated to one another.

6. The piezoelectric resonant part according to claim 1, wherein said first and second adhesive layers are laminated to one another.

7. The piezoelectric resonant part according to claim 1, wherein each of said first adhesive layers is disposed on the side of its associated protective substrate and each of said second layers is disposed on the side of said piezoelectric substrate.

8. The piezoelectric resonant part according to claim 7, wherein said electrode patterns cooperate with said piezoelectric substrate to define a vibrating element and wherein cut out portions are formed in said second adhesive layers to define vibration spaces for said vibrating element.

9. The piezoelectric resonant part according to claim 8, wherein a cut out portions are also formed in said first adhesive layers to further define said vibration spaces.

10. The piezoelectric resonant part according to claim 1, wherein said electrode patterns cooperate with said piezoelectric substrate to define a vibrating element and wherein cut out portions are formed in said second adhesive layers to define vibration spaces for said vibrating element.

11. The piezoelectric resonant part according to claim 10, wherein a cut out portions are also formed in said first adhesive layers to further define said vibration spaces.

12. The piezoelectric resonant part according to claim 1, wherein said first and second adhesive layers are made of thermosetting adhesive material.

* * * * *